(12) United States Patent
Srivastava et al.

(10) Patent No.: US 10,496,332 B2
(45) Date of Patent: Dec. 3, 2019

(54) DATA PATH TRAINING AND TIMING SIGNAL COMPENSATION FOR NON-VOLATILE MEMORY DEVICE INTERFACE

(71) Applicant: Intel Corporation, Santa Clara, CA (US)

(72) Inventors: Amit Kumar Srivastava, Folsom, CA (US); Sriram Balasubrahmanyam, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 15/844,964

(22) Filed: Dec. 18, 2017

(65) Prior Publication Data

US 2019/0187929 A1    Jun. 20, 2019

(51) Int. Cl.
*H04L 7/00*    (2006.01)
*G06F 3/06*    (2006.01)

(52) U.S. Cl.
CPC .......... *G06F 3/0659* (2013.01); *G06F 3/0613* (2013.01); *G06F 3/0679* (2013.01)

(58) Field of Classification Search
CPC ..... G06F 3/0659; G06F 3/0613; G06F 3/0679
USPC ........................................................ 375/372
See application file for complete search history.

(56) References Cited

U.S. PATENT DOCUMENTS

| | | | |
|---|---|---|---|
| 9,886,987 B1* | 2/2018 | Brahmadathan ..... | G11C 7/1072 |
| 2014/0293718 A1* | 10/2014 | Prakash ................ | G06F 3/0418 |
| | | | 365/193 |
| 2014/0321229 A1* | 10/2014 | Duffner ................ | G11C 7/1009 |
| | | | 365/233.13 |
| 2015/0095547 A1* | 4/2015 | Bains ................... | G06F 13/4243 |
| | | | 711/5 |
| 2017/0110165 A1* | 4/2017 | Kim ...................... | G11C 7/1072 |

* cited by examiner

*Primary Examiner* — Don N Vo
(74) *Attorney, Agent, or Firm* — Schwegman Lundberg & Woessner, P.A.

(57) ABSTRACT

Some embodiments include apparatuses and methods using the apparatuses. Some of the apparatuses include a device that includes an interface for communication with a host. The device includes components that can operate during at least one of read link training and duty cycle distortion compensation operation.

17 Claims, 10 Drawing Sheets

DATA PATH TRAINING AND TIMING SIGNAL COMPENSATION FOR NON-VOLATILE MEMORY DEVICE INTERFACE

TECHNICAL FIELD

Embodiments described herein pertain to communication between devices in electronic systems. Some embodiments relate to interface training between integrated circuit devices.

BACKGROUND

Many electronic systems, such as computers, tablets, and cellular phones, include different devices. Examples of such devices include a host (e.g., a processor device), a memory device, and other integrated circuit (IC) device. The devices communicate with each other using signals (e.g., data signals and timing signals (e.g., strobe signals)). To improve accuracy in signals communicated between these devices, many conventional techniques are available for calibration of circuitry (e.g., receivers and transmitters) in these devices. In some conventional techniques, one device (e.g., a host) may perform all or a major portion of such calibration. Such conventional techniques may be burdensome on the device that performs the calibration.

DETAILED DESCRIPTION

Figure 1:
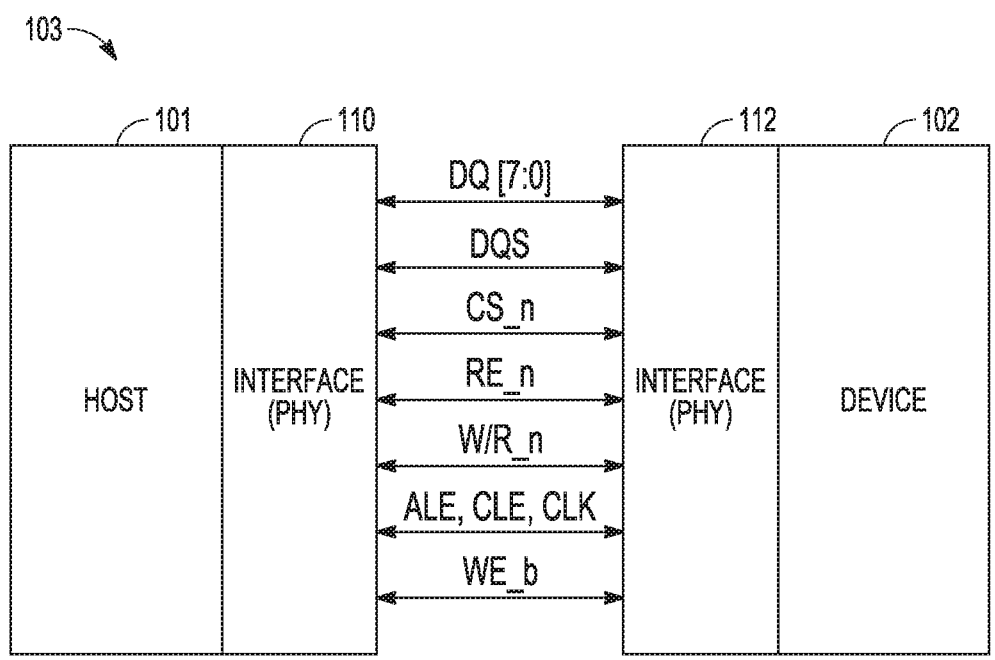
FIG. 1 shows an apparatus including a host, a device, and a channel between the host and device, according to some embodiments described herein.

The techniques described herein relate to NAND Flash interface. However, the described techniques may also be used in other Input/Output (I/O) communication with a memory device (e.g., a NAND memory device).

Open NAND Flash Interface (ONFI) standards, which is one of the interface for NAND interface include communications between NAND flash memory device and other devices (e.g., a host, such as a processor device). Techniques defined NAND memory device input/output interface (NAND interface) run maximum speed up to 800 megatransfers per second (MT/s). Future storage solutions targeted host interfaces, such as Peripheral Component Interconnect Express (PICe) Gen 3 and Gen 4 (PCIe-Gen3/4) and Universal Flash Storage version 3.0 (UFS 3.0) or beyond for NAND interface in order to have large storage capacity. In order to saturate PCIe/UFS host interfaces with a lower number of channels, a NAND IO interface speed needs to scale up much faster (e.g., up to 1600 MT/s or higher) than the IO interface speed defined by NAND Interfaces. Some recently developed NAND interfaces (e.g., the Toggle-mode NAND interface) can have an increased speed of up to 1200 MT/s.

Operating IO interfaces at a relatively high speed (e.g., up to 1600 MT/s or higher) suffers significant AC timing margin loss due to channel losses, NAND internal variations (e.g., due to process, voltage, and temperature (PVT) and internal timing mismatches) and host-side inherit losses (e.g., due to host-side DQ (data) and DQS (clock) mismatches). These factors can result in read AC timing margin loss or incorrect read data (e.g., data transferred from NAND device to the host). These losses may be much worse especially for higher multi-die stacking NAND memory device. Overcoming these losses can result in excessive power consumption. Another NAND implementation involves using an intermediate device (e.g., interface chip/repeater/retimer) between a host and NAND memory device in order accommodate a higher number of die stacks. Running such an intermediate device at a relatively higher speed can also suffer significant AC timing margin loss that can lead to read timing margin loss or incorrect read data.

The techniques described herein include solutions to resolve above-mentioned challenges for read operation in a memory device (e.g., NAND device) by providing a read link training mechanism (e.g., circuitry) at the memory device (e.g., NAND) side (or alternatively interface-chip side, repeater side, and retimer side). The read link training mechanism can improve read system AC timing margin loss. In this mechanism, the device (e.g., NAND/interface chip/repeater/retimer) coupled to the host is responsible for detecting read command from the host, generating internal data (e.g., 32 bits stress data pattern) based on mask information (sent by host), and storing the internal generated data in a memory circuit (e.g., a first-in first-out (FIFO)) in the device. The device is also responsible for sending back to the host (upon a request from the host) the internal generated data (stored in the FIFO of the memory device) in which the data is aligned with strobe signals (provided by the device). The host can use the read data (internally generated data from the FIFO of the device) to calibrate the host's internal timing. Unlike some conventional interface training techniques where the burden of the interface training is implemented in the host-side only, the interface training described herein can be performed in part by the device coupled to the host. This interface training technique can reduce burden for the host to implement and perform interface training.

Operating IO interfaces in NAND/interface chip/repeater/retimer at a relatively high speed (e.g., up to 1600 MT/s or higher) also suffers significant duty cycle distortion (DCD) related to timing margin loss due to the above-mentioned factors (e.g., channel losses, NAND internal PVT variations). The techniques described herein also include solutions to resolve above-mentioned challenges by providing DCC link training mechanism at the NAND/interface chip/repeater/retimer side to improve system DCD-related AC timing margin loss. In this mechanism, the device (e.g., NAND/interface chip/repeater/retimer) coupled to the host is responsible for performing automatic RE detection (e.g., read enable detection) and calibrating duty cycle of RE buffer and generating improved DQS signals (e.g., DCD free DQS signals). The device is also responsible for sending to the host (upon a request from the host) a status indication that includes information of whether DCD is completed. The device also takes advantage of toggling of RE to calibrate internal oscillating signal (e.g., ring oscillating (OSC) signal). Unlike some conventional calibration techniques where the burden of the calibration (e.g., calibration for the link coupled to the double-data rate (DDR) memory device and embedded MultiMediaCard (eMMC) memory device (DDR/eMMC) devices) implemented in the host-side only, the calibration described herein can be performed in part by the device coupled to the host. This calibration technique can reduce burden for the host to implement and perform calibration.

Other improvements and benefits of the read link training and DCC link training are described below.

FIG. 1 shows an apparatus including a host 101, a device 102, and a channel 103 between host 101 and device 102, according to some embodiments described herein. Host 101 can include or can be included in a processor (e.g., a general-purpose processor, or an application-specific integrated circuit (ASIC)), a computer (e.g., a server), a networking device, a computer storage system, or other electronic devices or systems. Device 102 can include a memory device (e.g., a flash memory device (e.g., NAND flash memory device)), an interface device (e.g., an interface chip), a repeater, a retimer, or other devices. Channel 103 can include conductive paths to carry signals that are communicated between host 101 and device 102. The conductive paths of channel 103 can include metal wires (e.g., metal traces on a circuit board). As shown in FIG. 1, host 101 and device 102 can include interfaces 111 and 112, respectively, coupled to channel 103. Each of interfaces 111 and 112 can include circuitry (e.g., physical layer (PHY) circuitry) to transmit and receive signals through channel 103.

Host 101 and device 102 can communicate with each other to exchange information (e.g., data, clock, and control information) in the form of signals. Examples of such signals include CE_b (chip enable signal), CLE (command latch enable), ALE (address latch enable), CLK (clock signal), WE_b (write enable), RE/RE_b (read enable), W/R_n (read/write direction), DQ (data signals), and DQS (strobe signals). The signals shown in FIG. between host 101 and device 102 (and the signals shown in other figures in this description) can be based on ONFI specification. One skilled in the art would readily recognize that host 101 and device 102 can communicate with each using other signals (not shown). Device 102 can include any of the devices described below with reference to FIG. 2 through FIG. 18.

Figure 2:
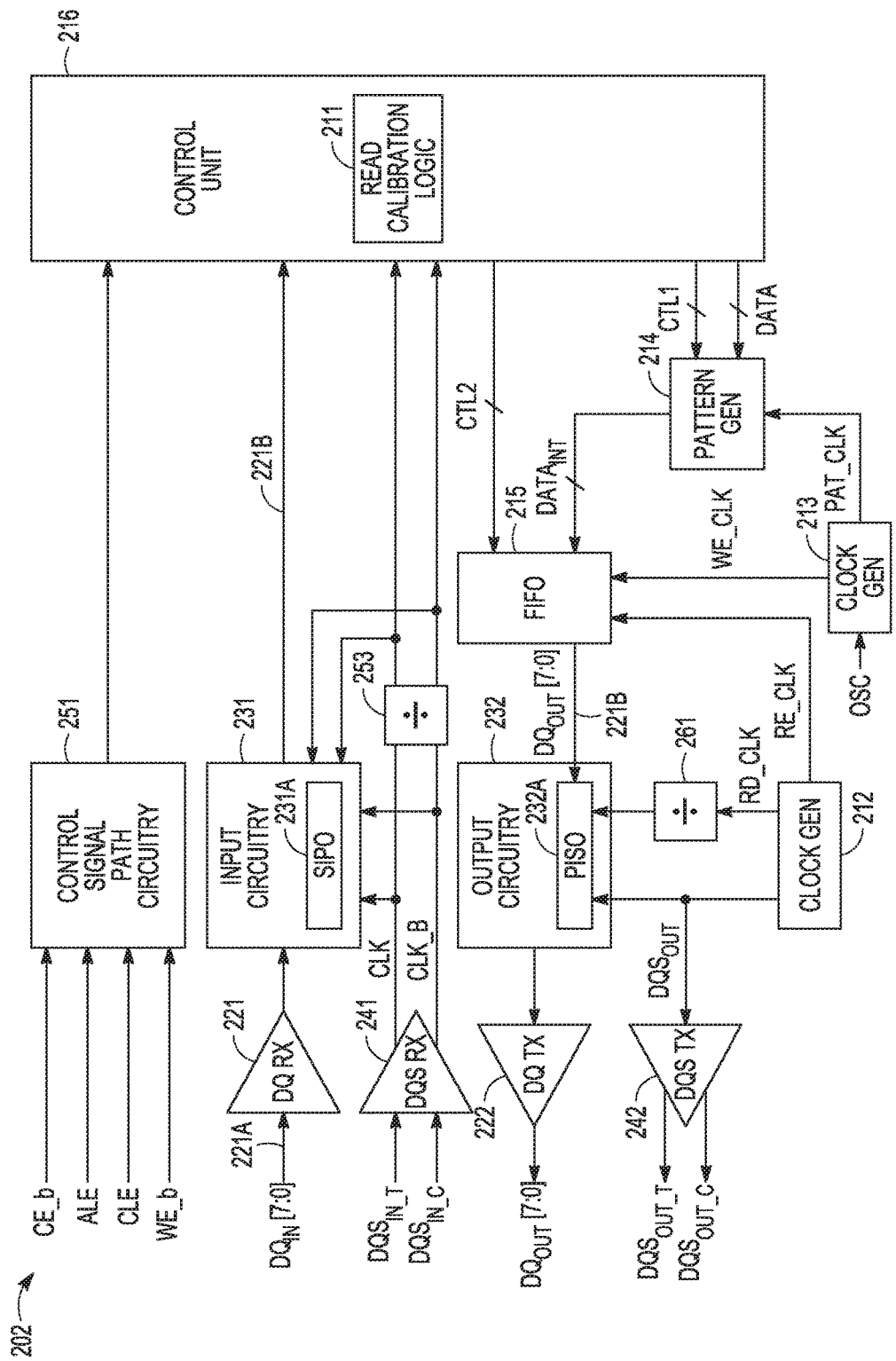
FIG. 2 shows a memory device including read training circuitry, according to some embodiments described herein.

FIG. 2 shows a memory device 202 including read training circuitry 210, according to some embodiments described herein. As shown in FIG. 2, memory device 202 can receive signals that are similar to those described above with reference to FIG. 1, including signals CE_b, CLE, ALE, CLK, WE_b, RE/RE_b, W/R_n, DQin [7:0], DQout [7:0]. $DQS_{IN\_T}$, and $DQS_{IN\_C}$, $DQS_{OUT\_T}$, and $DQS_{OUT\_C}$. Signals DQin [7:0] and DQout [7:0] can be represented by signals DQ of FIG. 1. Signals $DQS_{IN\_T}$, and $DQS_{IN\_C}$, $DQS_{OUT\_T}$, and $DQS_{OUT\_C}$ can be represented by signals DQS of FIG. 1.

As shown in FIG. 2, memory device 202 can include control signal path circuitry 251 (e.g., which can include components such as buffers and latches) to provide signals CE_b, ALE, CLE, and WE_b to control unit 216. Memory device 202 can perform memory operations (e.g., read, write, and read link training operations) based on timing (e.g., signal levels) of signals CE_b, CLE, ALE, CLK, WE_b, and RE/RE_b.

Memory device 202 can include DQ buffer (e.g., input data buffer (receiver (RX)) 221 to receive data signals (e.g., input data signals) DQin [7:0] from another device (e.g., host 101). Data signals DQin [7:0] can be provided to memory device 202 during a write operation of memory device 202. Memory device 202 can include input circuitry 231 to provide data signals DQin [7:0] (from DQ buffer 221) to control unit 216. Data signals DQin [7:0] can include eight bits (e.g., bit 0 through bit 7 (denotes as [7:0])) that can be provided concurrently (e.g., transferred in parallel) on paths (circuit paths) 221a and 221b. Thus, DQ buffer 221 can include eight separate receiver circuits to concurrently receive (e.g., receive in parallel) eight bits carried by (included in) signals DQin [7:0]. Input circuitry 231 can include a serial-in parallel-out (SIPO) circuit 231a to receive signals DQin [7:0] from DQ buffer 221 and provide them to path 221b. Thus, each of paths 221a and 221b can include eight separate circuit paths to concurrently carry the bits (e.g., eight bits) of data signals DQin [7:0].

Memory device 202 can include DQ buffer (e.g., output data buffer (transmitter (TX))) 222 to provide data signals (e.g., output data signals) DQout [7:0] to another device (e.g., host 101). Data signals DQout [7:0] can be provided by memory device 202 during a read operation of memory device 202. Memory device 202 can include output circuitry 232 to receive data signals DQout [7:0] (from internal components (e.g., memory circuit such as FIFO 215)) of memory device 202 and provide data signals DQout [7:0] to DQ buffer 222. Data signals DCout [7:0] can include eight bits (e.g., bit 0 through bit 7 (denoted as [7:0])) that can be provided concurrently (e.g., transferred in parallel) on paths (circuit paths) 222a and 222b. Thus, DQ buffer 222 can include eight separate receiver circuits to concurrently receive (e.g., receive in parallel) eight bits carried by (included in) signals DQout [7:0]. Output circuitry 232 can include a parallel-in serial-out (PISO) circuit 232a to receive signals DQout [7:0] on path 222b from internal components (e.g., FIFO 215) of memory device 202. Thus, each of paths 222a and 222b can include eight separate circuit path to concurrently carry the bits (e.g., eight bits) of data signals DQout [7:0].

FIG. 2 shows each data signal DQin [7:0] and DQout [7:0] including eight bits (e.g., bit 0 through bit 7) as an example. However, the number of bits concurrently carried by data signals DQin [7:0] can vary, and the number of bits of concurrently carried by data signals DQout [7:0] can vary. For example, data signals DQin [7:0] may carry 16 bits in parallel, and data signals DQout [7:0] may carry 16 bits in parallel.

As shown in FIG. 2, memory device 202 can include DQS buffer (e.g., input strobe buffer (receiver (RX))) 241 to receive strobe signals (e.g., input strobe signals) $DQS_{in\_T}$ and $DQS_{IN\_C}$ from another device (e.g., host 101). Strobe signals $DQS_{IN\_T}$ and $DQS_{IN\_C}$ can be true and complement signals (two separate clock signals). Strobe signals $DQS_{IN\_T}$ and $DQS_{IN\_C}$ can be provided to memory device 202 during a write operation. DQS buffer 241 can generate clock signals CLK and CLK_B that can have the same frequency as strobe signals $DQS_{OUT\_T}$ and $DQS_{OUT\_C}$. Memory device 202 can receive data signals DQin [7:0] based on timing of clock signals CLK and CLK_B. Memory device 202 can include a divider (e.g., divided by four) 253 to divide clock signals CLK and CLK_B. Input circuitry 231 can use the divided clock signals (not shown) at the output of divider 253 to sample data signals DQin [7:0] and provide them to control unit 216.

Memory device 202 can include DQS buffer (e.g., strobe output buffer (transmitter (TX))) 242 to provide strobe signals (e.g., output strobe signals) $DQS_{OUT\_T}$ and $DQS_{OUT\_C}$ to another device (e.g., host 101). Strobe signals $DQS_{OUT\_T}$ and $DQS_{OUT\_C}$ can be true and complement signals (two separate clock signals). Strobe signals $DQS_{OUT\_T}$ and $DQS_{OUT\_}C$ can be provided by memory device 202 to another device (e.g., host 101) during a read operation. Another device (e.g., host 101) can receive data signals DQout [7:0] from memory device 202 on timing of strobe signals $DQS_{OUT\_T}$ and $DQS_{OUT\_C}$.

DQ buffers 221 and 222 and DQS buffers 241 and 242 can be part of an interface (e.g., PHY) of memory device 202 to allow communication (e.g., transferring of signals) to and from memory device 202.

As shown in FIG. 2, read training circuitry 210 can include read calibration controller logic 211, clock generators 212 and 213, a pattern generator 214, and a memory circuit such as a FIFO 215. Read calibration controller logic 211 can be part of a control unit 216 of memory device 202. In operation, read training circuitry 210 of memory device 202 can operate to detect a read command sent by a host (e.g., host 101 of FIG. 1)) during a read link training mode. Then, read training circuitry 210 can generate internal data pattern (e.g., stress data pattern) $DATA_{INT}$ based on mask information (e.g., mask bits or mask byte (or bytes)) provided by the host. As an example, internal data $DATA_{INT}$ can include 32 bytes of data). Read training circuitry 210 can store internal data pattern $DATA_{INT}$ in FIFO 215. Upon request from the host, read training circuitry 210 can send internal data pattern $DATA_{INT}$ (sent as data signals DQout [7:0]) and output strobe signals $DQS_{OUT\_T}$ and $DQS_{OUT\_C}$ (generated by memory device 202) to the host. Data signals DQout [7:0]) and strobe signals $DQS_{OUT\_T}$ and $DQS_{OUT\_C}$ can be aligned (e.g., edge aligned) when they are sent to the host. The host can use the data pattern included in data signals DQout [7:0] (which are generated based on (e.g., are the same as) internal data pattern $DATA_{INT}$ in memory device 202) to calibrate internal timing of the host. Details of the operation of read training circuitry 21 is described below with reference to FIG. 2, FIG. 3, and FIG. 4.

Figure 3:
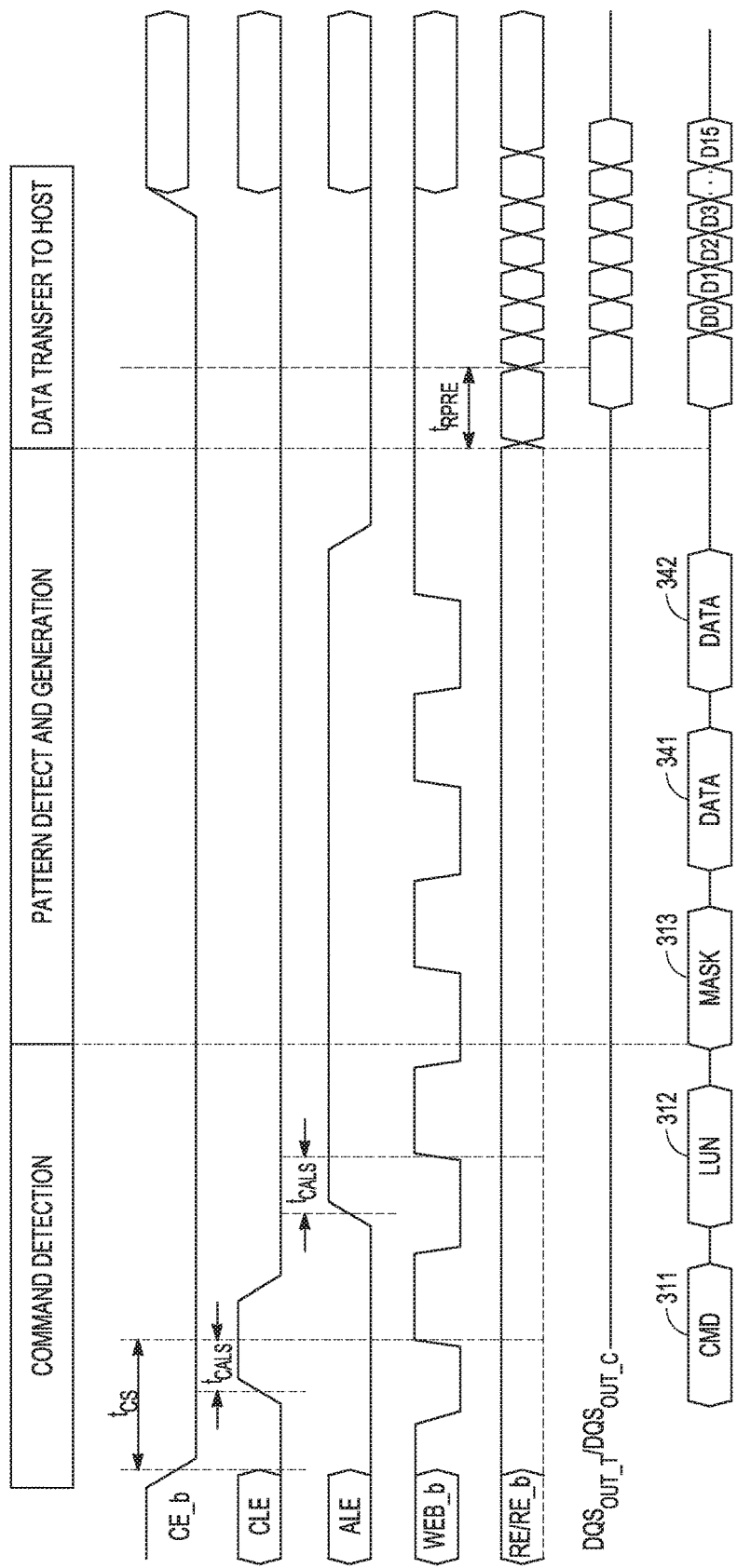
FIG. 3 shows an example timing diagram of some of the signals of the memory device of FIG. 2 during a read link training operation, according to some embodiments described herein.

FIG. 3 shows an example timing diagram of some of the signals of memory device 202 of FIG. 2 during a read link training operation, according to some embodiments described herein. The following description refers to FIG. 2 and FIG. 3. As shown in FIG. 3, the read link training operation can include a command detection phase, a pattern detect and generation phase, and data transfer to host phase. Timing intervals $t_{CS}$, $t_{CALS}$, and $t_{RPRE}$ indicate relative timing intervals (e.g., setup time intervals) based on the switching levels (e.g., edge transitions) of the respective signals as shown in FIG. 3 corresponding to signals ALE, CLE, and WE_b. The level of the signals during command detection phase of FIG. 3 can indicate a presence of a command for the read link training described herein. For example, the levels of signals ALE, CLE, and WE_b during command detection phase of FIG. 3 can indicate that a request by a host (e.g., host 101) has been issued to memory device 202 to cause memory device 202 to perform the read link training operation.

During the command detection phase in FIG. 3, read calibration controller logic 211 (FIG. 2) can detect commands (e.g., a read command) based on the combination of the levels of signals ALE, CLE, and WE_b. Specific combinations of the levels of signals ALE, CLE, and WE_b can allow memory device 202 to determine different operations (e.g., read, write, and read link training) of memory device 202.

Data signals DQ [7:0] in FIG. 3 can represent either data signals sent by the host or data to be provided to the host, depending on which phase of the read link training that memory device 202 operates. For example, during command detection phase and the pattern detect and generation phase in FIG. 3, data signals DQ [7:0] can represent data signals DQin [7:0] (e.g., sent by host 101 to memory device 202) that can include information 311, LUN information 312, mask information (e.g., mask byte) 313, and data patterns 341 and 342. Information 311 can be user-defined information, which can include a command CMD to perform the read link training. Based on mask information 313 and data patterns 341 and 342 in FIG. 3, read training circuitry 210 can generate internal data pattern $DATA_{INT}$ (FIG. 2) to be stored in FIFO 215 (FIG. 2). During the data transfer to host phase in FIG. 3, data signals DQ [7:0] (which include a number of bits (e.g., bits D0 through D15 as shown in FIG. 3)) can represent data signals DQout [7:0] sent from memory device 202 to host 101. As described above, data signals DQout [7:0] sent from memory device 202 to the host are generated based on internal data pattern $DATA_{INT}$ stored in FIFO 215.

Referring to FIG. 2, during the read link training mode, read calibration controller logic 211 of FIG. 2 can enable (e.g., activate) pattern generator 214 and clock generator 213. Pattern generator 214 can operate to generate internal data pattern $DATA_{INT}$ (e.g., 32 bytes of data) based on control information CTL1, data information DATA provided by control unit 216, and clock signal PAT_CLK provided by clock generator 213. Data information DATA can be generated based on data patterns 341 and 342 (FIG. 3) received from the host. Clock generator 213 can generate clock signals PAT_CLK and WE_CLK based on an internal oscillating clock signal OSC of memory device 202. Read calibration logic 211 of FIG. 2 can provide control information CTL2 to FIFO 215. FIFO 215 can operate to store internal data pattern DATA_INT (generated by pattern generator 214) using timing provided by clock signal WE_CLK.

Read training circuitry 210 can wait for the toggling of signals RE/REb. The toggling of signals RE/REb is an indication of a command (e.g., a request) sent by the host to read the data pattern $DATA_{INT}$ (stored in FIFO 215). Read training circuitry 210 can generate strobe signals $DQS_{OUT\_T}$ and $DQS_{OUT\_C}$ based on the timing (e.g., the toggling) of signals RE/Reb. Clock generator 212 can respond to the toggling of signals RE/Reb and generate clock signals RE_CLK and RD_CLK, and strobe signal $DQS_{OUT}$. DQS buffer 242 can generate strobe signals $DQS_{OUT\_T}$ and $DQS_{OUT\_c}$ based on strobe signal $DQS_{OPUT}$. FIFO 215 can use clock signal RE_CLK to read (e.g., unload) internal data pattern $DATA_{INT}$. A divider (e.g., divided by four) 261 can divide clock signal RD_CLK and provide a divided clock signal RD_CLK_DIV to output circuitry 232, which can use divided clock signal RD_CLK_DIV to receive internal data pattern $DATA_{INT}$ from FIFO 215 and clock signal $DQS_{OUT}$ to provide internal data pattern $DATA_{INT}$ to DQ buffer 222.

During the data transfer to host phase, data signals DQout [7:0] and strobe signals $DQS_{OUT\_T}$ and $DQS_{OUT\_C}$ can be aligned (e.g., edge aligned) and sent to the host. As mentioned above, the host can use data signals DQout [7:0] to calibrate internal timing of the host.

Figure 4:
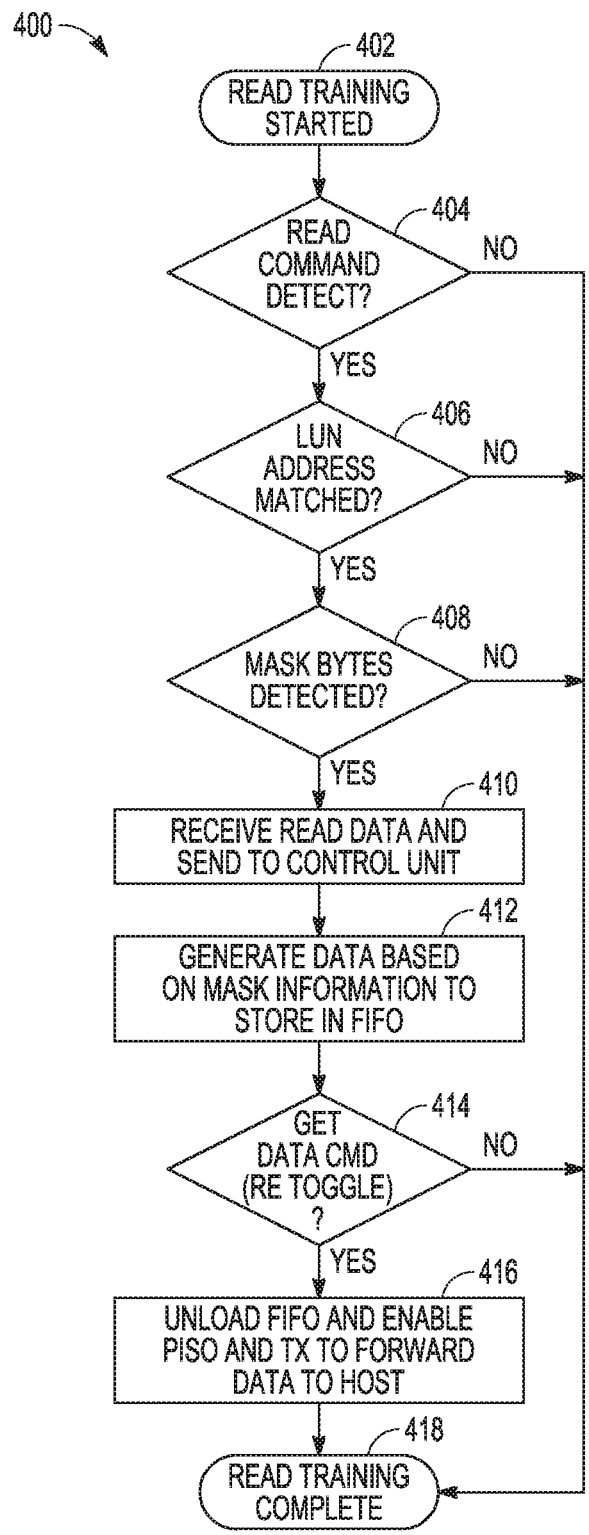
FIG. 4 is flowchart showing a method of performing a read link training, according to some embodiments described herein.

FIG. 4 is flowchart showing a method 400 of performing a read link training, according to some embodiments described herein. Method 400 can be performed by memory device 202 of FIG. 2 (e.g., performed by at least read training circuitry 210 of memory device 202). As shown in FIG. 4, method 400 can start the read link training operation at activity 402 and complete the read link training operation at activity 418. Method 400 can include activity 404 that can include detecting a read command (e.g., a read command sent by a host). If activity 404 does not detect a read command (indicated by "NO" in FIG. 4), then method 400 can skip the rest of the read link training operation and go to activity 418. This means that method 400 may terminate the read link training (e.g., not perform the read link training) because of lack of information to perform the read link training. If activity 404 detects a read command (indicated by "YES" in FIG. 4), then method 400 can continue with activity 406.

Activity 406 can include determining whether the logic unit number (LUN) information (e.g., LUN address) associated with the read command sent by the host match the LUN information associated with (e.g., assigned to) memory device 202. If activity 406 determines that the LUN information sent by the host does not match the LUN information associated with memory device 202 (indicated by "NO" in FIG. 4), then method 400 can skip the rest of the read link training operation and go to activity 418. This means that method 400 may terminate the read link training (e.g., not perform the read link training) because of lack of information to perform the read link training. If activity 406 determines that the LUN information sent by the host matches the LUN information associated with memory device 202 (indicated by "YES" in FIG. 4), then method 400 can continue with activity 408.

Activity 408 can include detecting mask information (e.g., mask bytes sent by a host). If activity 408 does not detect the mask information (indicated by "NO" in FIG. 4), then method 400 can skip the rest of the read link training operation and go to activity 418. This means that method 400 may terminate the read link training (e.g., not perform the read link training) because of lack of information to perform the read link training. If activity 408 detects the mask information, then method 400 can continue with activity 410.

Activity 410 can include receiving data (e.g., data patterns 241 and 242) sent to memory device 202 from the host. Activity 410 can include sending the received data to the control unit (e.g., control unit 216 of FIG. 2) of memory device 202.

Activity 412 of method 400 can include generating internal data based on the received data and the mask information. Activity 412 can include storing the generated internal data in a FIFO (e.g., FIFO 215) of the memory device 202.

Activity 414 can include detecting get data command. The get data command can be in the form of the toggling of signal RE. For example, if the RE signal toggles after an amount of time has elapsed from the end of the command detection phase (e.g., from when the mask information is detected), then it can be determined that the get data command is detected. In this example, if the RE signal does not toggle after an amount of time has elapsed from the end of the command detection phase (e.g., from when the mask information is detected), then it can be determined that the get data command is not detected. If activity 414 does not detect the get data command (indicated by "NO" in FIG. 4), then method 400 can skip the rest of the read link training operation and go to activity 418. This means that method 400 may terminate the read link training (e.g., not perform the read link training) because of lack of information to perform the read link training. If activity 414 detects the get data command (indicated by "YES" in FIG. 4), then method 400 can continue with activity 416.

Activity 416 can include retrieving (e.g., unloading) the internal data stored in the FIFO of the memory device 202 and enabling output circuitry, which can include a Parallel In Serial Out (PISO) circuit (e.g., a half rate PISO circuit) and transmitters. Activity 416 can also include sending the internal data from the FIFO to the output circuitry and from the output circuitry to the host. Then, method 400 can complete the read link training at activity 418.

Some of the improvements and benefits of the read link training described above with reference to FIG. 1 through FIG. 4 include improving interfaces' scalability for solid-state drive (SSD) solution and operating link beyond a relatively high data transfer rate (e.g., 1600 MT/s or higher), increasing storage capacity and improving (e.g., reducing) latency, improving read link AC timing margin, reducing internal timing error at memory device side due to mismatches and PVT variations, and mitigating channel losses. The read link training of memory device 202 also helps in saving significant post-silicon validation effort cost to improve AC margin and may avoid software- or firmware-based trimming. Further, improvements and benefits of the read link training described above with reference to FIG. 1 through FIG. 4 can help the host to calibrate the host's data transmission timing.

Figure 5:
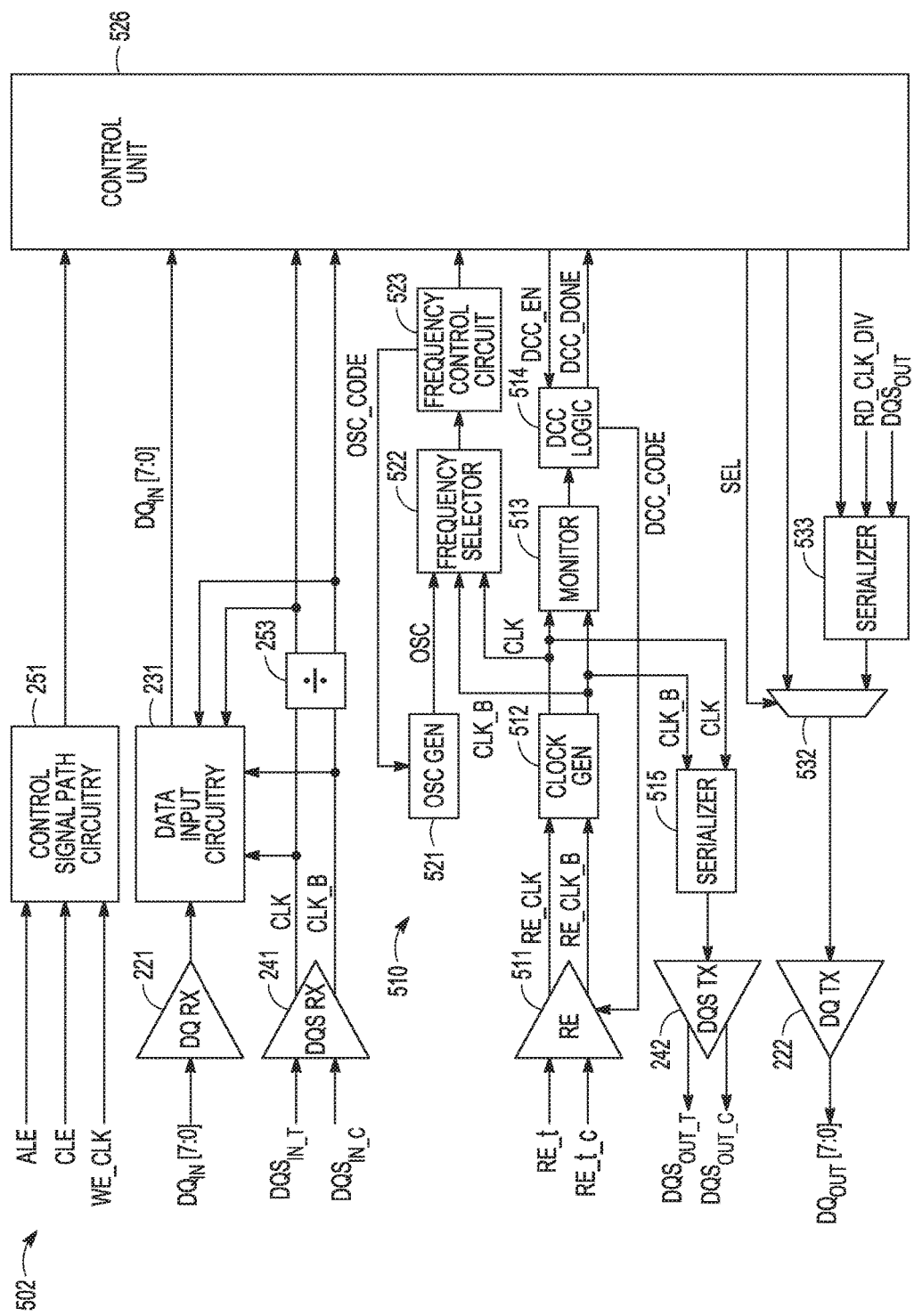
FIG. 5 shows a memory device including duty cycle distortion (DCD) compensation circuitry, according to some embodiments described herein.

FIG. 5 shows a memory device 502 including duty cycle distortion (DCD) compensation circuitry 510, according to some embodiments described herein. Memory device 502 can include elements (e.g., physical components (e.g., buffers and circuitry) and signals) that are similar to or identical to some of the elements of memory device 202 of FIG. 2. Thus, for simplicity, similar or identical elements between FIG. 2 and FIG. 5 are given the same labels and their descriptions are not repeated.

As shown in FIG. 5, compensation circuitry 510 can include RE buffer (e.g., input buffer (receiver (RX)) 511 to receive signals (complementary read enable signals) RE_t and RE_t_c and generate clock signals (complementary signals) RE_CLK and RE_CLK_B based on signals RE_t and RE_t_c. Compensation circuitry 510 can include a clock generator 512 to generate clock signals (complementary signals) CLK and CLK_B based on signals RE_CLK and RE_CLK_B. Clock signals (complementary signals) CLK and CLK_B can be used to generate strobe signals $DQS_{OUT\_T}$ and $DQS_{OUT\_C}$, respectively. For example, clock signals CLK and CLK_B can be provided to DQS buffer 242 through a serializer 515 DQS buffer 242 can operate to provide signals (complementary signals) $DQS_{OUT\_T}$ and $DQS_{OUT\_C}$ based on clock signals CLK and CLK_B. Memory device 502 can send (e.g., send to host 101) data signals $DQS_{OUT}$ [7:0] and strobe signals $DQS_{OUT\_T}$ and $DQS_{OUT\_C}$ during a read operation of memory device 202.

As shown in FIG. 5, compensation circuitry 510 can include a monitor 513 and DCC logic 514 (e.g., logic circuitry). Memory device 502 can include a control unit 526 that can operate to detect the levels of signals ALE and CLE that indicate a command (e.g., request by a host) has been issued to memory device 502 to cause memory device 502 to perform the DCC calibration operation. Based on the detection, control unit 526 can enable (e.g., by using information DCC_EN) DCC logic 514 to detect the toggling of signals RE_t and RE_t_c (e.g., by monitoring clock signals CLK and CLK_B) and begin part of the DCC calibration operation. DCC logic may provide information DCC_DONE to control unit 526 when the DCC calibration operation is done.

Monitor 513 can operate to detect the toggling of signals RE_t and RE_t_c (e.g., by monitoring the levels of clock signals CLK and CLK_B). Monitor 513 can compare the average value (e.g., average voltage value) of clock signals CLK and CLK_B with a reference voltage. Since clock signals CLK and CLK_B are generated based on signals RE_CLK and RE_CLK_B, the average of clock signals CLK and CLK_B can also be the average of signals RE_CLK and RE_CLK_B. Further, since signals RE_CLK and RE_CLK_B are generated based on signals RE_t and RE_t_c, the average of signals RE_CLK and RE_CLK_B can also be the average of signals RE_t and RE_t_c. Thus, the average of clock signals CLK/CLK_B, the average of signals RE_CLK/RE_CLK_B, and the average of signals RE_t and RE_t_c can have the same relationship with a specific (e.g., predetermined) reference value. For example, the average of each of clock signals CLK/CLK_B, signals RE_CLK/RE_CLK_B, and signals RE_t and RE_t_c can be less than a reference value. In another example, the average of each of signals CLK/CLK_B, signals RE_CLK/RE_CLK_B, and signals RE_t and RE_t_c can be equal to a reference value. In a further example, the average each of clock signals CLK/CLK_B, signals RE_CLK/RE_CLK_B, and signals RE_t and RE_t_c can be greater than a reference value.

As shown in FIG. 5, compensation circuitry 510 can include DCC logic (e.g., circuitry) 514 to control (e.g., adjust) RE buffer 511 based on the result of the comparison performed by monitor 513. As mentioned above, monitor 513 can compare the average values of clock signals CLK and CLK_B with a reference voltage and provide the result of the comparison. Based on the result of the comparison, DCC logic 514 can adjust RE buffer 511 to reduce or eliminate duty cycle distortion of clock signals CLK and CLK_B, so that the values of clock signals CLK and CLK_B are be within an acceptable (e.g., predetermined values) duty cycle value. As an example, DCC logic 514 can adjust RE buffer 511 by providing different values for code DCC_CODE (a digital code that can include multiple bits) to decrease, hold (keep the same), or increase the frequency of signals RE_CLK and RE_CLK_B (which are used to generate clock signals CLK and CLK_B) until monitor 513 determines (e.g., based on the result of the comparison) that the values (e.g., average values) of clock signals CLK and CLK_B are within an acceptable duty cycle value.

Compensation circuitry 510 can also operate to adjust the frequency of a signal OSC (an internal oscillating) that can be internally generated by an internal oscillator (e.g., a local ring oscillator) 521. The frequency of signal OSC can be set (e.g., programmed) to be N times (where N is a real number) the frequency of clock signals CLK and CLK_B (which is also N times the frequency of signals RE_t and RE_t_c).

Compensation circuitry 510 can include a frequency detector 522 that can operate to determine (e.g., compare) the relationship between the frequency of clock signals CLK and CLK_B and frequency of signal OSC. Compensation circuitry 510 can include a control circuit 523 (which can include a finite state machine (FSM)) that can operate to control (e.g., adjust) the frequency of signal OSC based on the relationship between the frequency of clock signals CLK and CLK_B and frequency of signal OSC. For example, control circuit 523 can use different values of a code OSC_CODE (digital code) to control internal oscillator 521 in order to decrease, hold (keep the same), or increase the frequency of signal OSC, such that the frequency of signal OSC can be N times (e.g., a predetermined value) frequency of clock signals CLK and CLK_B.

Compensation circuitry 510 can include a multiplexer 532 that can respond to select information (e.g., signal) SEL to selectively provide output data DQout [7:0] to DQ buffer 222. Data signals DQout [7:0] can be either data signals DQ [0:7] from control unit 526 or serialized data signals from a serializer 533.

Figure 6:
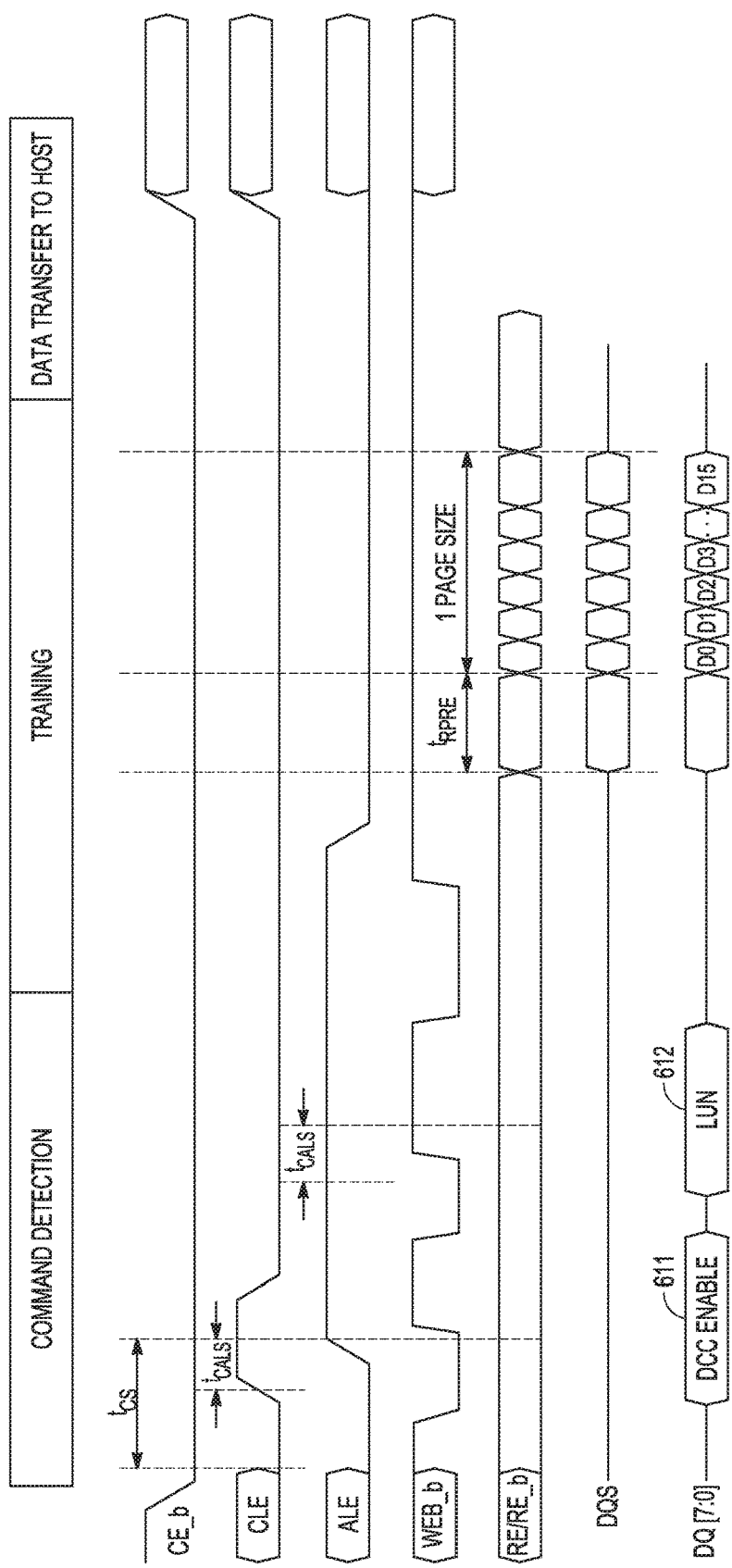
FIG. 6 shows an example timing diagram of some of the signals of the memory device of FIG. 5 during a duty cycle compensation (DCC) training operation, according to some embodiments described herein.

FIG. 6 shows an example timing diagram of some of the signals of memory device 502 of FIG. 5 during a DCC training operation, according to some embodiments described herein. The following description refers to FIG. 5 and FIG. 6. In FIG. 6, timing intervals $t_{CS}$, $t_{CALS}$, and $t_{RPRE}$ (which are different from those of FIG. 3) indicate relative timing intervals (e.g., setup time intervals) based on the switching levels (e.g., edge transitions) of corresponding signals ALE, CLE, and WE_b. Timing intervals $t_{CS}$, $t_{CALS}$, and $t_{RPRE}$ indicate relative timing intervals (e.g., setup time intervals) based on the switching levels (e.g., edge transitions) of the respective signals as shown in FIG. 3 corresponding to signals ALE, CLE, and WE_b. The level of the signals during the command detection phase of FIG. 3 can indicate a presence of a command for the DCC training operation described herein.

As shown in FIG. 6, the DCD compensation operation can include a command detection phase, a training phase, and data transfer to host phase. During the command detection phase in FIG. 6, compensation circuitry 510 (FIG. 5) can detect commands (e.g., a DCC command) based on the combination of the levels of signals ALE, CLE, and WE_b. The host can send information 611 (e.g., DCC Enable indication) to memory device 502 and cause memory device 502 to enable DCC link training, and LUN information 612 to indicate that the enable DCC link training is for memory device 502. During the training phase, the host can continue to drive signals RE_t and RE_t_c for a time interval equivalent to one page cycle (or alternatively for a time interval different from one page cycle). During the DCC training phase in FIG. 6, data signals DQ [7:0] (which include a number of bits (e.g., bits D0 through D15 shown in FIG. 6)) can represent data signals DQout [7:0] sent from memory device 202 to a host (e.g., host 101). During the training phase, the host is not sampling DQ signals or Mask DQ signal. During the training phase, compensation circuitry 510 can adjust RE buffer 511 based on training (e.g., based on code DCC_CODE provided by DCC logic 514, as described above with reference to FIG. 5). During the training phase, compensation circuitry 510 can also adjust OSC generator 521 (as described above). During data transfer to host phase, memory device 502 can send an indication of DCC training status upon request from the host.

Figure 7:
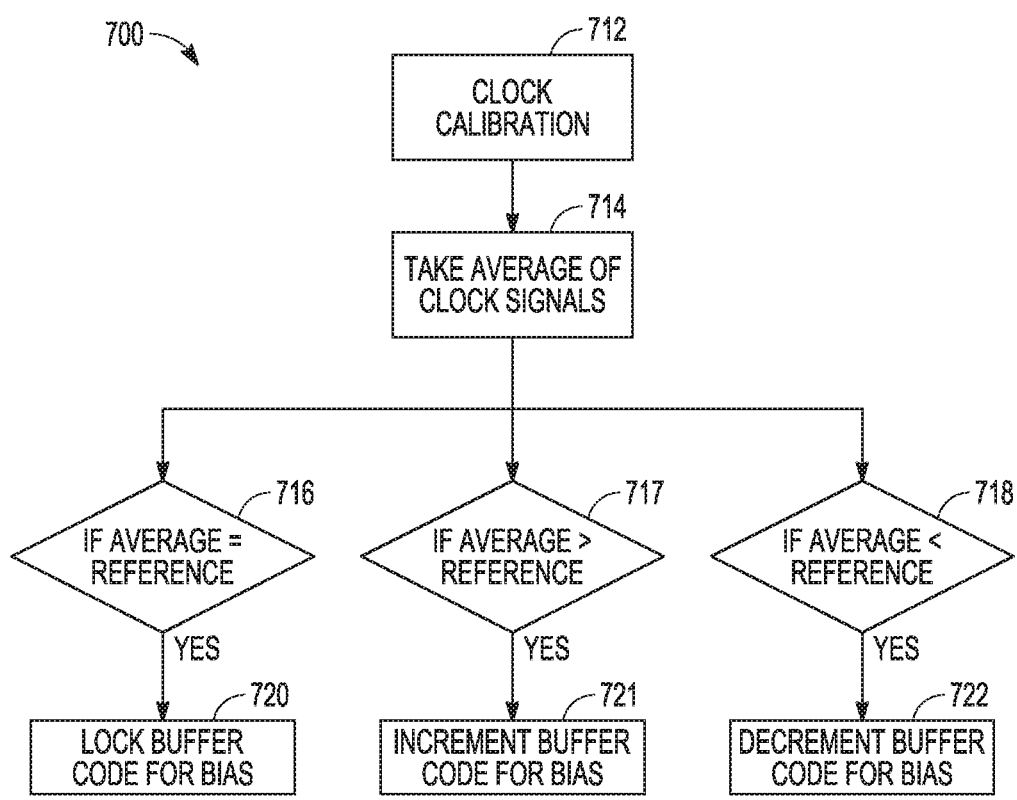
FIG. 7 is a flowchart showing a method of performing clock signal calibration, according to some embodiments described herein.

FIG. 7 is flowchart showing method 700 of performing clock signal calibration, according to some embodiments described herein. Method 700 can include activity 712 that can include starting the clock signal calibration. For example, activity 712 can be performed during DCC training phase (FIG. 6). Method 700 can include activity 714 that can include calculating an average of clock signals. The clock signals can include clock signals CLK and CLK_B (FIG. 6). As described above, the average of clock signals CLK/CLK_B is also the average of signals RE_CLK/RE_

CLK_B, and the average of signals RE_t and RE_t_c. In FIG. 7, method 700 can include activities 716, 717, and 718 that can respectively determine whether the average (calculated in activity) 714 is equal to, greater than, or less than a reference value (e.g., a predetermined value). Method 700 can control (e.g., adjust) the code (e.g., DCC_CODE in FIG. 5) that controls the buffer (e.g., RE buffer 511 in FIG. 5) that generates the clock signals clock signals CLK/CLK_B) in activity 714 or the signals (signals RE_t/RE_t_c or RE_CLK/RE_CLK_B). For example, method 700 can include activities 720, 721, and 722 that can perform respective operations of locking the buffer codes that control biasing of the buffer, incrementing the buffer codes that control biasing of the buffer, or decrementing the buffer codes that control biasing of the buffer if the average is equal to, greater than, or less than a reference value, respectively.

Figure 8:
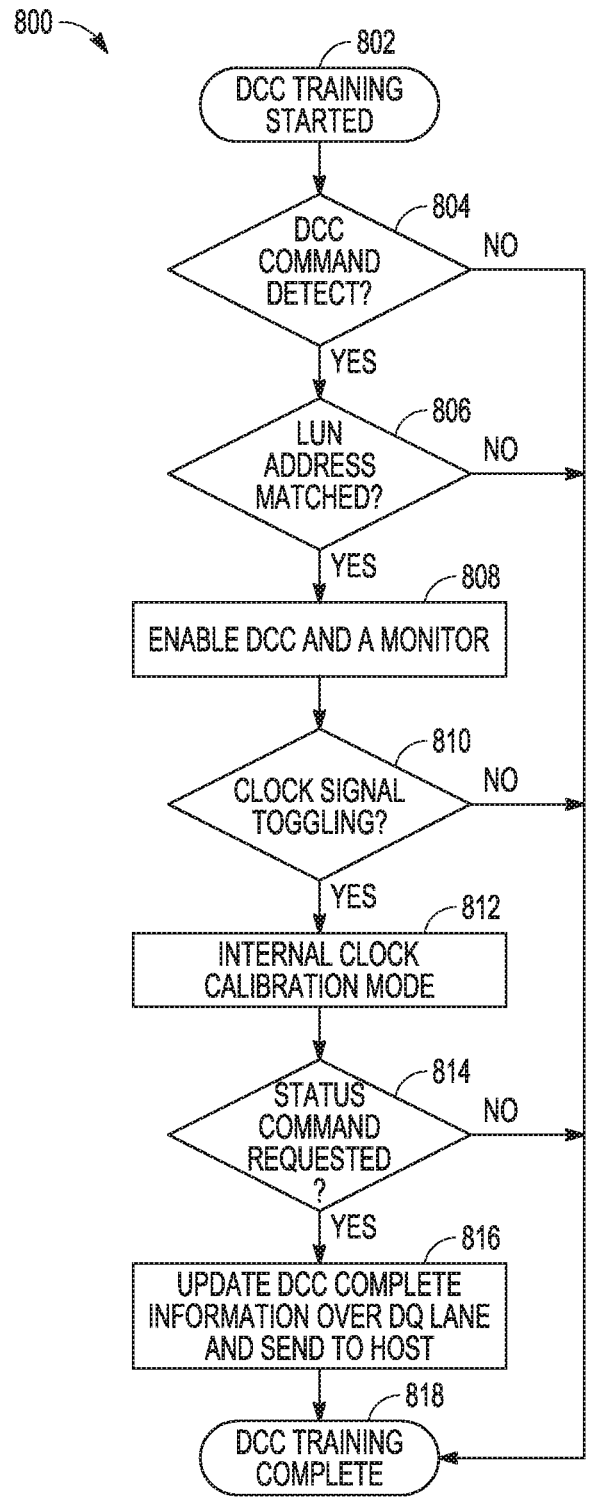
FIG. 8 is a flowchart showing a method of performing DCC training, according to some embodiments described herein.

FIG. 8 is a flowchart showing a method 800 of performing DCC training, according to some embodiments described herein. Method 800 can be performed by memory device 502 of FIG. 5 (e.g., performed by at least compensation circuitry 510 of memory device 502). As shown in FIG. 8, method 800 can start the DCC training operation at activity 802 and complete the DCC training operation at activity 818. Method 800 can include activity 804 that can include detecting a DCC command (e.g., a DCC command sent by a host). If activity 804 does not detect a DCC command (indicated by "NO" in FIG. 8), then method 800 can skip the rest of the DCC training operation and go to activity 818. This means that method 800 may terminate the DCC training (e.g., not perform the DCC training) because of lack of information to perform the DCC training. If activity 804 detects a DCC command (indicated by "YES" in FIG. 8), then method 800 can continue with activity 806.

Activity 806 can include determining whether the LUN information (e.g., LUN address) associated with the DCC command sent by the host matches the LUN information associated with (e.g., assigned to) memory device 502. If activity 806 determines that the LUN information sent by the host does not match the LUN information associated with memory device 502 (indicated by "NO" in FIG. 8), then method 800 can skip the rest of the DCC training operation and go to activity 818. This means that method 800 may terminate the DCC training (e.g., not perform the DCC training) because of lack of information to perform the DCC training. If activity 806 determines that the LUN information sent by the host matches the LUN information associated with memory device 202 (indicated by "YES" in FIG. 8), then method 800 can continue with activity 808.

Activity 808 can include enabling DCC logic (e.g., DCC logic 514) and a monitor (e.g., monitor 513). Activity 810 of method 800 can include detecting the toggling of clock signals (e.g., clock signals CLK and CLK_B). If activity 810 does not detect the toggling of clock signals (indicated by "NO" in FIG. 8), then method 800 can skip the rest of the DCC training operation and go to activity 818. This means that method 800 may terminate the DCC training (e.g., not perform the DCC training) because of lack of information to perform the DCC training. If activity 810 detects the toggling of clock signals, then method 800 can continue with activity 812.

Activity 812 can include calibration of internal clock signals. Activity 812 can include the activities of method 700 shown in FIG. 7.

Activity 814 can include detecting a status command request from the host. If activity 814 does not detect the status command request from the host (indicated by "NO" in FIG. 8), then method 800 can skip the rest of the DCC training operation and go to activity 818. This means that method 800 may terminate the DCC training (e.g., not perform the DCC training) because of lack of information to perform the DCC training. If activity 814 detects the status command request, then method 800 can continue with activity 816.

Activity 816 can include updating DCC to compare complete information over DQ lane (e.g., through DQ buffer in FIG. 8) and send information of DCC training status to the host. Then, method 800 can complete the DCC training at activity 818.

Figure 9:
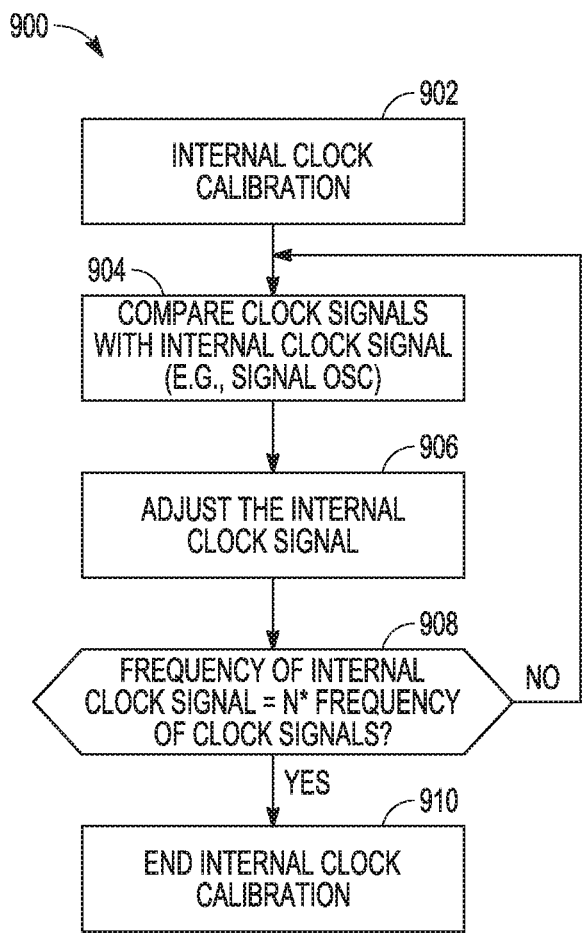
FIG. 9 is a flowchart showing a method of performing an internal oscillating signal calibration, according to some embodiments described herein.

FIG. 9 is a flowchart showing a method 900 of performing an internal oscillating signal calibration, according to some embodiments described herein. Method 900 can be performed by memory device 502 of FIG. 5 (e.g., performed by at least compensation circuitry 510 of memory device 502). As shown in FIG. 9, method 900 can include activity 902 that can include starting the DCC training operation. Method 900 can include activity 904 that can include comparing clock signals (e.g., clock signals CLK and CLK_B) with an internal oscillating signal (e.g., signal OSC in FIG. 5). The clock signals can be clock signals CLK and CLK_B in FIG. 5 (which are generated based on signals RE_CLK and RE_CLK_B, which are generated based on signals RE_t and RE_t_c). Method 900 can include activity 906 that can adjust the internal oscillating signal based on the result of the comparison. For example, activity can 906 can increase the frequency of the internal oscillating signal if the frequency of the internal oscillating signal is less than N times the frequency of the clock signals (N can be one or greater than one). In another example, activity can 906 can decrease the frequency of the internal oscillating signal if the frequency of the internal oscillating signal is greater than N times the frequency of the clock signals.

Method 900 can include activity 908 that can include determining whether the frequency of the internal oscillating signal is equal to N times the frequency of the clock signals. If frequency of the internal oscillating signal is not equal to N times the frequency of the clock signals (indicated by "NO" in FIG. 9), then method 900 can repeat activities 904 and 906. If the frequency of the internal oscillating signal is equal to N times the frequency of the clock signals (indicated by "YES" in FIG. 9), then method 900 can continue with activity 910, which can include ending the internal oscillating signal calibration.

Some of the improvements and benefits of the DCC training described above with reference to FIG. 5 through FIG. 9 include improving interfaces' scalability for SSD solution and operating links beyond a relatively high data transfer rate (e.g., 1600 MT/s or higher), improving DCD related link AC timing margin, reducing internal timing error at the memory device side due to mismatches and PVT variations, and mitigating channel losses. The DCC training of memory device 202 also helps in saving significant post-silicon validation effort cost to improve AC margin and may avoid software- or firmware-based trimming.

The above description with reference to FIG. 5 through FIG. 9 describes DCC training for RE buffer 511. However, similar (or identical) techniques can also be used for DCC training for DQS buffer 241. For example, memory device 502 can use monitor 513 and DCC logic 514 to generate code DCC_CODE (as described above with reference to FIG. 5) to adjust DQS buffer 241 in order to reduce or eliminate duty cycle distortion of clock signals CLK and CLK_B at the output of DQS buffer 241.

Figure 10:
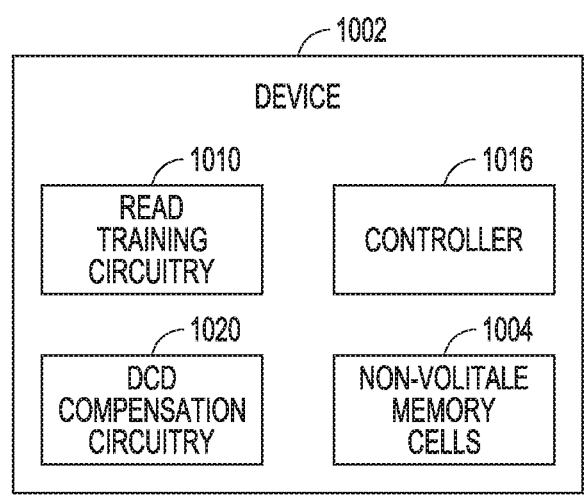
FIG. 10 shows a device including read training circuitry and compensation circuitry, according to some embodiments described herein.

FIG. 10 shows a device 1002 including read training circuitry 1010 and compensation circuitry 1020, according to some embodiments described herein. Device 1002 can include device 102 of FIG. 1. For example, device 1002 can include a memory device (e.g., a flash memory device (e.g., NAND flash memory device)) that can include a control unit 1016 and memory cells (e.g., non-volatile memory cells including flash memory cells) 1004. Control unit 1016 can perform the functions control unit 216 (FIG. 2) and control units 526 (FIG. 5). Alternatively, device 1002 can include an interface device (e.g., an interface chip), a repeater, a retimer, or other devices. Read training circuitry 1010 and DCD compensation circuitry 1020 can be read training circuitry 210 of FIG. 2 and compensation circuitry 510 of FIG. 5, respectively. Although device 1002 includes read training circuitry 1010 and DCD compensation circuitry 1020, one of circuitry 1010 and 1020 can be omitted from device 1002.

ADDITIONAL NOTES AND EXAMPLES

In Example 1 includes subject matter (such as a device, an electronic apparatus (e.g., circuit, electronic system, or both), or a machine) including an interface to communicate with a host, a calibration logic to detect signals indicating a training operation from the host, a buffer to receive data and mask information sent by the host for the training operation, a data pattern generator to generate internal data based on the data and the mask information, a memory circuit to store the internal data, and output circuitry to send the internal data to the host based on a request from the host.

In Example 2, the subject matter of Example 1 may optionally include, further comprising a read calibration logic to enable the memory circuit to provide the internal data to the output circuit upon toggling of a signal indicating the request from the host.

In Example 3, the subject matter of Example 2 may optionally include, further comprising an additional buffer to send strobe signals with data signals to the host, the data signal carrying bits of the internal data.

In Example 4, the subject matter of Example 2 or 3 may optionally include, further comprising a clock generator to generate a first clock signal and a second clock signal based on the signal indicating the request from the host, wherein the memory circuit is to provide the internal data to the output circuit based on timing of the first clock signal, and the output circuitry is to provides the internal data to the host based on timing of the second clock signal.

In Example 5, the subject matter of Example 4 may optionally include, further comprising an additional clock generator to generate a third first clock signal based on timing of an oscillating signal, and the data pattern generator is to generate the internal data based on timing of the third clock signal.

In Example 6, the subject matter of Example 4 may optionally include, wherein the memory circuit is a first-in first-out memory circuit.

In Example 7, the subject matter of Example 1 may optionally include, wherein the apparatus comprises a memory device.

Example 8 includes subject matter (such as a device, an electronic apparatus (e.g., circuit, electronic system, or both), or a machine) including an interface to communicate with a host, a buffer to receive a signal sent by the host and to receive code, a calibration logic to detect signals indicating a training operation from a host coupled to the interface, and to detect toggling of the signal after signals indicating a training operation are detected, a clock generator to generate clock signals based on the signal received by the buffer, a monitor to compare an average value of the clock signals with a reference voltage to generate a comparison result, and a logic to control value of the code based on the comparison result to control timing of the clock signals.

In Example 9, the subject matter of Example 8 may optionally include, wherein the logic is to adjust the value of the code during a time interval when the signal toggles.

In Example 10, the subject matter of Example 8 or 9 may optionally include, wherein the logic is to increase the value of the code if an average value of the clock signals are greater than the reference voltage, and the logic is to decrease the value of the code if the average value of the clock signals are less than the reference voltage.

In Example 11, the subject matter of Example 8 or 9 may optionally include, further comprising a control circuit to generate an additional code to adjust the frequency of an oscillating signal based on the frequency of the signal received by the buffer.

In Example 12, the subject matter of Example 8 may optionally include, further comprising an additional buffer to provide strobe signals generated by the clock signals.

In Example 13, the subject matter of Example 8 may optionally include, wherein the logic is to provide a status of the training to the host based a request from the host.

In Example 14, the subject matter of Example 8 may optionally include, further comprising additional buffers to provide data signals to the host, wherein the host is to refrain from sampling data signals at the additional buffers.

In Example 15, the subject matter of Example 8 may optionally include, wherein the apparatus comprises a flash memory device.

Example 16 includes subject matter (such as a device, an electronic apparatus (e.g., circuit, electronic system, or both), or a machine) including a host, a communication channel coupled to the host, and a non-volatile memory device coupled to the communication channel, the non-volatile memory device including a calibration logic to detect signals indicating a training operation from the host, a buffer to receive data and mask information sent by the host for the training operation, a data pattern generator to generate internal data based on the data and the mask information, a memory circuit to store the internal data, and output circuitry to send the internal data to the host based on a request from the host.

In Example 17, the subject matter of Example 16 may optionally include, further comprising an additional buffer to receive a signal sent by the host and to receive code, a clock generator to generate clock signals based on the signal received by the additional buffer, a monitor to compare an average value of the clock signals with a reference voltage to generate a comparison result, and a logic to control value of the code based on the comparison result to control timing of the clock signals.

In Example 18, the subject matter of Example 17 may optionally include, wherein the additional buffer includes an input strobe buffer to receive an input strobe signal from the host.

In Example 19, the subject matter of Example 16 may optionally include, wherein the communication channel includes metal wires on a circuit board.

In Example 20, the subject matter of Example 16 may optionally include, wherein the apparatus comprises a processor.

Example 21 includes subject matter (such as a method of operating a device, an electronic apparatus (e.g., circuit, electronic system, or both), or a machine) including detecting, at a memory device, signals from a host that indicate a training operation from the host, receiving data and mask information sent by the host for the training operation, generating internal data at the memory device based on the data and the mask information received from the host, storing the internal data in the memory device, and sending the internal data to the host based on a request from the host.

In Example 22, the subject matter of Example 22 may optionally include, wherein further comprising enabling the memory circuit to provide the internal data to the host based on a toggling of a signal indicating the request from the host.

In Example 23, the subject matter of Example 22 may optionally include, further comprising sending strobe signals with data signals to the host in response to the toggling of the signal, the data signal carrying bits of the internal data.

Example 24 includes subject matter (such as a method of operating a device, an electronic apparatus (e.g., circuit, electronic system, or both), or a machine) including receiving a code at a buffer, detecting, at a memory device, signals from a host that indicates a training operation from the host, detecting toggling of an additional signal after the signals sent by the host are detected, generating clock signals based on the additional signal, comparing an average value of the clock signals with a reference voltage to generate a comparison result, and controlling a value of the code based on the comparison result in order to control timing of the clock signals.

In Example 25, the subject matter of Example 22 or 23 may optionally include, wherein further comprising generating an additional code to adjust the frequency of an oscillating signal at the memory device based on the frequency of the signal received by the buffer.

Example 26 includes subject matter (such as a device, an electronic apparatus (e.g., circuit, electronic system, or both), or machine) including means for performing any of the subject matter of Examples 1 through 25.

The subject matter of Examples 1 through 26 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   an interface to communicate with a host;
   a calibration logic to detect signals indicating a training operation from the host;
   a buffer to receive data and mask information sent by the host for the training operation;
   a data pattern generator to generate internal data based on the data and the mask information;
   a memory circuit to store the internal data;
   output circuitry to send the internal data to the host based on a request from the host
   a read calibration logic to enable the memory circuit to provide the internal data to the output circuit upon toggling of a signal indicating the request from the host; and
   a clock generator to generate a first clock signal and a second clock signal based on the signal indicating the request from the host, wherein the memory circuit is to provide the internal data to the output circuit based on timing of the first clock signal, and the output circuitry is to provides the internal data to the host based on timing of the second clock signal.

2. The apparatus of claim 1, further comprising an additional buffer to send strobe signals with data signals to the host, the data signal carrying bits of the internal data.

3. The apparatus of claim 1, further comprising an additional clock generator to generate a third first clock signal based on timing of an oscillating signal, and the data pattern generator is to generate the internal data based on timing of the third clock signal.

4. The apparatus of claim 1, wherein the memory circuit is a first-in first-out memory circuit.

5. The apparatus of claim 1, wherein the apparatus comprises a memory device.

6. An electronic apparatus comprising:
   an interface to communicate with a host;
   a buffer to receive a signal sent by the host and to receive code;
   a calibration logic to detect signals indicating a training operation from a host coupled to the interface, and to detect toggling of the signal after signals indicating a training operation are detected;
   a clock generator to generate clock signals based on the signal received by the buffer;
   a monitor to compare an average value of the clock signals with a reference voltage to generate a comparison result; and
   a logic to control value of the code based on the comparison result to control timing of the clock signals, wherein the logic is to adjust the value of the code during a time interval when the signal toggles.

7. The apparatus of claim 6, further comprising an additional buffer to provide strobe signals generated by the clock signals.

8. The apparatus of claim 6, wherein the apparatus comprises a flash memory device.

9. An electronic apparatus comprising:
   an interface to communicate with a host;
   a buffer to receive a signal sent by the host and to receive code;
   a calibration logic to detect signals indicating a training operation from a host coupled to the interface, and to detect toggling of the signal after signals indicating a training operation are detected;
   a clock generator to generate clock signals based on the signal received by the buffer;
   a monitor to compare an average value of the clock signals with a reference voltage to generate a comparison result; and
   a logic to control value of the code based on the comparison result to control timing of the clock signals, wherein the logic is to increase the value of the code if an average value of the clock signals are greater than the reference voltage, and the logic is to decrease the value of the code if the average value of the clock signals are less than the reference voltage.

10. The apparatus of claim 9, wherein the logic is to provide a status of the training to the host based a request from the host.

11. An electronic apparatus comprising:
an interface to communicate with a host;
a buffer to receive a signal sent by the host and to receive code;
a calibration logic to detect signals indicating a training operation from a host coupled to the interface, and to detect toggling of the signal after signals indicating a training operation are detected;
a clock generator to generate clock signals based on the signal received by the buffer;
a monitor to compare an average value of the clock signals with a reference voltage to generate a comparison result;
a logic to control value of the code based on the comparison result to control timing of the clock signals; and
a control circuit to generate an additional code to adjust the frequency of an oscillating signal based on the frequency of the signal received by the buffer.

12. An electronic apparatus comprising:
an interface to communicate with a host;
a buffer to receive a signal sent by the host and to receive code;
a calibration logic to detect signals indicating a training operation from a host coupled to the interface, and to detect toggling of the signal after signals indicating a training operation are detected;
a clock generator to generate clock signals based on the signal received by the buffer;
a monitor to compare an average value of the clock signals with a reference voltage to generate a comparison result;
a logic to control value of the code based on the comparison result to control timing of the clock signals; and
additional buffers to provide data signals to the host, wherein the host is to refrain from sampling data signals at the additional buffers.

13. An electronic apparatus comprising:
a host;
a communication channel coupled to the host; and
a non-volatile memory device coupled to the communication channel, the non-volatile memory device including:
a calibration logic to detect signals indicating a training operation from the host;
a buffer to receive data and mask information sent by the host for the training operation;
a data pattern generator to generate internal data based on the data and the mask information;
a memory circuit to store the internal data;
output circuitry to send the internal data to the host based on a request from the host; and
a clock generator to generate a first clock signal and a second clock signal based on the signal indicating the request from the host, wherein the memory circuit is to provide the internal data to the output circuit based on timing of the first clock signal, and the output circuitry is to provides the internal data to the host based on timing of the second clock signal.

14. The apparatus of claim 13, further comprising:
an additional buffer to receive a signal sent by the host and to receive code;
a monitor to compare an average value of the clock signals with a reference voltage to generate a comparison result; and
a logic to control value of the code based on the comparison result to control timing of the clock signals.

15. The apparatus of claim 14, wherein the additional buffer includes an input strobe buffer to receive an input strobe signal from the host.

16. The apparatus of claim 13, wherein the communication channel includes metal wires on a circuit board.

17. The apparatus of claim 13, wherein the apparatus comprises a processor.

* * * * *